(12) United States Patent
Yang et al.

(10) Patent No.: US 9,329,248 B2
(45) Date of Patent: May 3, 2016

(54) NON-CYLINDRICAL CABLE BALUN DESIGN FOR RF COILS

(71) Applicant: General Electric Company, Schenectady, NY (US)

(72) Inventors: Tae Young Yang, Streetsboro, OH (US); Gabriel Searles, Stow, OH (US); Thomas Edward Zink, North Royalton, OH (US); Yun-Jeong Stickle, Solon, OH (US); Darren Charles Gregan, Auburn, OH (US); Sahil Bhatia, Streetsboro, OH (US)

(73) Assignee: General Electric Company, Schenectady, NY (US)

( * ) Notice: Subject to any disclaimer, the term of this patent is extended or adjusted under 35 U.S.C. 154(b) by 487 days.

(21) Appl. No.: 13/936,832

(22) Filed: Jul. 8, 2013

(65) Prior Publication Data

US 2015/0008926 A1 Jan. 8, 2015

(51) Int. Cl.
*G01V 3/00* (2006.01)
*G01R 33/36* (2006.01)
*G01R 33/3415* (2006.01)

(52) U.S. Cl.
CPC ........ *G01R 33/3685* (2013.01); *G01R 33/3415* (2013.01)

(58) Field of Classification Search
USPC .......................................................... 324/322
See application file for complete search history.

(56) References Cited

U.S. PATENT DOCUMENTS

| | | | | |
|---|---|---|---|---|
| 4,682,125 A | * | 7/1987 | Harrison | G01R 33/3628 324/318 |
| 7,378,851 B1 | | 5/2008 | de Rooij et al. | |
| 7,652,476 B2 | | 1/2010 | de Rooij et al. | |
| 2011/0267061 A1 | * | 11/2011 | Taracila | G01R 33/3685 324/322 |
| 2014/0091791 A1 | * | 4/2014 | Bulumulla | G01R 33/3642 324/309 |
| 2014/0197832 A1 | * | 7/2014 | Driesel | H01Q 7/005 324/307 |
| 2014/0197836 A1 | * | 7/2014 | Hamamura | G01R 33/44 324/318 |

* cited by examiner

Primary Examiner — Rodney Fuller

(57) ABSTRACT

A non-cylindrical cable balun design having reduced space requirements and that provides for a lighter-weight RF coil is disclosed. The balun includes a balun shell having a non-cylindrical profile, a dielectric foam positioned within the balun shell so as to fill an interior volume defined by the balun shell, and one or more capacitors formed on the balun shell. A non-cylindrical coaxial cable that transmits electromagnetic signals to the balun extends through a length of the balun and is surrounded by the dielectric foam.

20 Claims, 4 Drawing Sheets

NON-CYLINDRICAL CABLE BALUN DESIGN FOR RF COILS

BACKGROUND OF THE INVENTION

Embodiments of the invention relate generally to a balun for use with radio frequency (RF) coils and, more specifically, to a non-cylindrical cable balun design having reduced space requirements and that provides for a lighter-weight RF coil.

MRI uses radio frequency pulses and magnetic field gradients applied to a subject in a strong homogenous magnetic field to produce viewable images. When a substance such as human tissue is subjected to a uniform magnetic field (polarizing field $B_0$), the individual magnetic moments of the spins in the tissue attempt to align with this polarizing field, but precess about it, in random order, at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

MR RF receiver coils receive the emitted electromagnetic signals emanating from the patient and use the acquired signals for image reconstruction. Before image reconstruction occurs, the electromagnetic signals received by the receiver coil elements are conditioned by a balun. The balun helps to improve performance of the receiver coils by providing a high impedance path for common-mode currents in the electromagnetic signal and a low impedance path for differential currents therein.

While conventional baluns are typically sufficient for their intended purpose, there are certain environments and/or implementations where the typical balun construction may be less than ideal. As one example, in some instances, the available space around certain RF surface coils may be constrained, such that that the profile of a conventional coaxial cable balun structure in the anterior/posterior (AP) direction might be overly obtrusive and cumbersome. For example, the available space in the expanded polypropylene (EPP) foam of a head-neck unit (HNU) coil for accommodating the RF coil structure and associated coaxial cable baluns may be quite limited. As another example, it may be desirable for an RF surface coil structure to be as lightweight as is feasible—such as when the RF surface coil is an anterior array (AA) coil positioned on top of a patient.

As still another example of an environment/implementation where the typical balun construction may be less than ideal, it is recognized that RF surface coils are often used in a hybrid or combination MRI system, where MR image data is acquired in conjunction with positron emission tomography (PET) image data. In combination PET-MRI systems, it is desirable to have minimum mass in the region of the PET detector array in order to provide for optimum image acquisition. That is, while in a stand-alone MR system the structure and mass of components within the bore has no effect on image acquisition and image quality, such is not the case in a PET-MRI system—as the mass in the PET detector region attenuates gamma rays, which reduces PET signal to the detectors and degrades image quality (IQ). Toward this end, it is recognized that the use of a conventional coaxial cable balun structure in an AA coil that is positioned in the region of the PET detector array can lead to a 9% PET peak single loss, which is undesirable and can negatively affect image quality.

It would therefore be desirable to provide a cable balun design that provides a lower profile inside RF coils and provides for a lighter RF coil structure. It would also be desirable for the cable balun design to provide less PET attenuation than a conventional coaxial cable balun.

BRIEF DESCRIPTION OF THE INVENTION

Embodiments of the invention provide a non-cylindrical cable balun design having reduced space requirements and reduced mass that provides for a lighter-weight RF coil, with the balun being useable in a stand-alone or hybrid MRI system, for example.

In accordance with one aspect of the invention, an MRI system includes at least one magnet for generating a magnetic field, at least one gradient coil for manipulating the magnetic field generated by the at least one magnet by way of a gradient field, at least one RF receiver coil to receive electromagnetic signals from the manipulated magnetic field, at least one balun in electrical communication with the at least one RF receiver coil to condition the received electromagnetic signals, and a non-cylindrical coaxial cable to transmit the received electromagnetic signals to the at least one balun. Each of the at least one baluns further includes a balun shell, a dielectric material positioned within the balun shell and surrounding the non-cylindrical coaxial cable which extends through the balun, and one or more capacitors formed on the balun shell.

In accordance with another aspect of the invention, a balun includes a balun shell having a non-cylindrical profile, a dielectric foam positioned within the balun shell so as to fill an interior volume defined by the balun shell, and one or more capacitors formed on the balun shell, wherein a non-cylindrical coaxial cable that transmits electromagnetic signals to the balun extends through a length of the balun and is surrounded by the dielectric foam.

In accordance with yet another aspect of the invention, an RF coil assembly includes an array of RF coil elements configured to receive electromagnetic signals from a manipulated magnetic field in an MRI system, a plurality of baluns in electrical communication with the array of RF coil elements to condition the received electromagnetic signals, and a non-cylindrical coaxial cable to transmit the received electromagnetic signals to the plurality of baluns. Each of the plurality of baluns further includes a non-cylindrical balun shell, a dielectric material positioned within the balun shell and surrounding the non-cylindrical coaxial cable which extends through the balun, and a plurality of capacitors positioned on an outer surface of the non-cylindrical balun shell.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

A non-cylindrical cable balun design is provided having reduced space requirements and reduced mass that provides for a lighter-weight RF coil. The non-cylindrical cable balun design provides the same electrical performance as a conventional RF coaxial cable balun, but reduces the PET attenuation caused by the balun, such as when used in a hybrid PET-MRI system.

According to embodiments of the invention, the non-cylindrical cable balun can be implemented with various RF coil arrays and in a variety of imaging systems or apparatuses. For example, the non-cylindrical cable balun can be used with a variety of RF surface coil arrays, such as AA coils and HNU coils, with such RF surface coil arrays in turn being incorporated into a stand-alone MR imaging system or being incorporated into a hybrid MR imaging system, such as a hybrid PET-MRI system, for example. Additionally, the non-cylindrical cable balun can be used with larger RF coils that form part of an MRI system—such as on whole-body coils that perform a receive function. Thus, while embodiments of the invention are set forth here below with respect to an AA coil in a hybrid PET-MRI system, it is recognized that other RF coil structures and stand-alone/hybrid MR imaging systems are considered to be within the scope of the invention.

Figure 1:
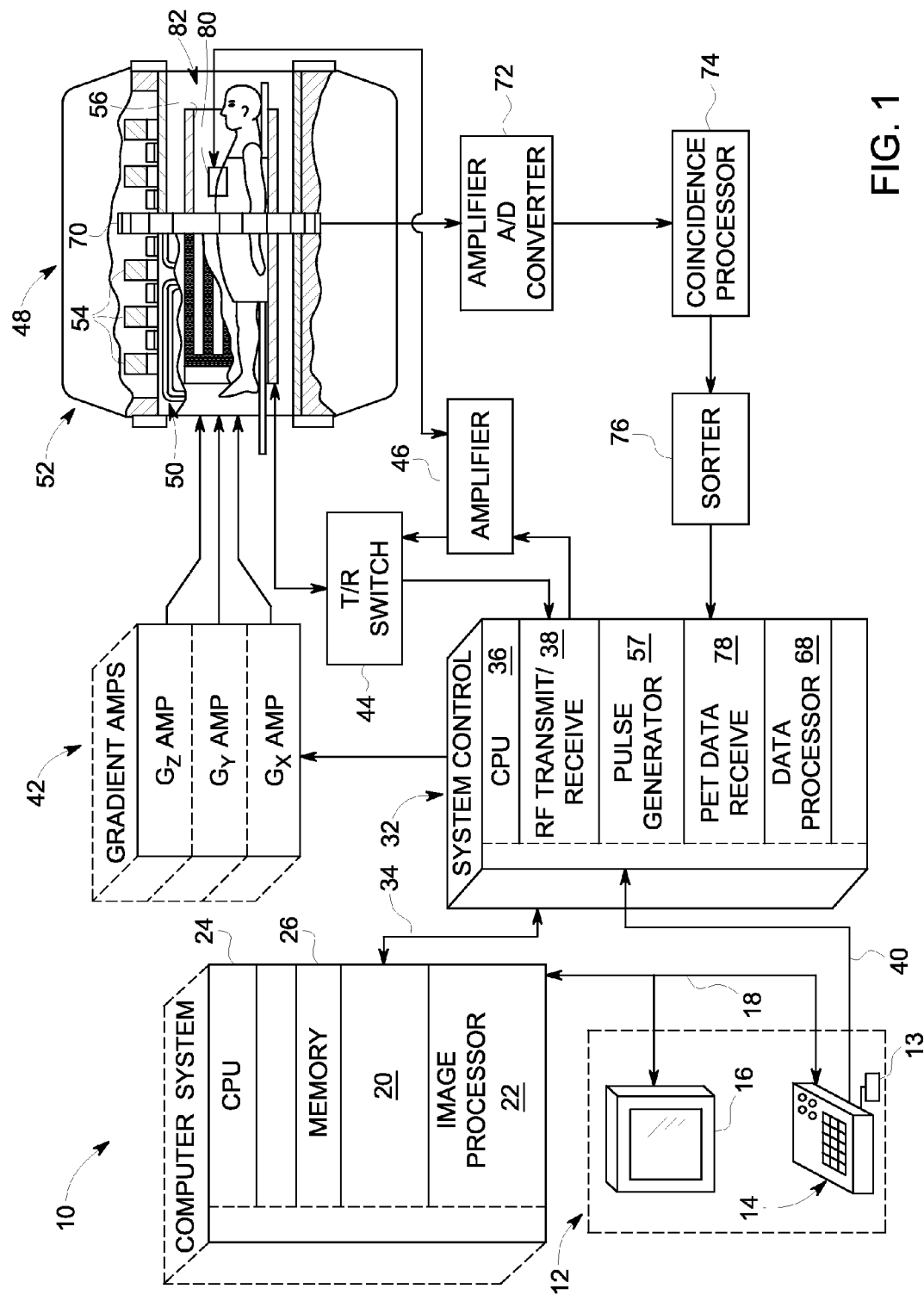
FIG. 1 is a schematic block diagram of an exemplary PET-MRI system for use with an embodiment of the invention.

Referring to FIG. 1, the major components of an exemplary hybrid PET-MRI system 10 that may incorporate embodiments of the present invention are shown. The operation of the system may be controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules, such as an image processor module 22, a CPU module 24 and a memory module 26. The computer system 20 may also be connected to permanent or back-up memory storage, a network, or may communicate with a separate system control 32 through link 34. The input device 13 can include a mouse, keyboard, track ball, touch activated screen, light wand, or any similar or equivalent input device, and may be used for interactive geometry prescription.

The system control 32 includes a set of modules in communication with one another and connected to the operator console 12 through link 40. It is through link 34 that the system control 32 receives commands to indicate the scan sequence or sequences that are to be performed. For MR data acquisition, an RF transmit/receive module 38 commands the scanner 48 to carry out the desired scan sequence, by sending instructions, commands, and/or requests describing the timing, strength and shape of the RF pulses and pulse sequences to be produced, to correspond to the timing and length of the data acquisition window. In this regard, a transmit/receive switch 44 and amplifier 46 control the flow of data to scanner 48 from RF transmit module 38 and from scanner 48 to RF receive module 38. The system control 32 also connects to a set of gradient amplifiers 42, to indicate the timing and shape of the gradient pulses that are produced during the scan.

The gradient waveform instructions produced by system control 32 are sent to the gradient amplifier system 42 having Gx, Gy, and Gz amplifiers. Amplifiers 42 may be external of scanner 48 or system control 32, or may be integrated therein. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and an RF coil 56. Alternatively, the gradient coils of gradient coil assembly 50 may be independent of the magnet assembly 52. The coils 56 of the RF coil may be configured for both transmitting and receiving, or for transmit-only or receive-only. A pulse generator 57 may be integrated into system control 32 as shown, or may be integrated into scanner equipment 48, to produce pulse sequences or pulse sequence signals for the gradient amplifiers 42 and/or the RF coil 56. In addition, pulse generator 57 may generate PET data blanking signals synchronously with the production of the pulse sequences. These blanking signals may be generated on separate logic lines for subsequent data processing. The MR signals resulting from the excitation pulses, emitted by the excited nuclei in the patient, may be sensed by the whole body coil 56 or by separate receive coils and are then transmitted to the RF transmit/receive module 38 via T/R switch 44. The MR signals are demodulated, filtered, and digitized in the data processing section 68 of the system control 32.

An MR scan is complete when one or more sets of raw k-space data has been acquired in the data processor 68. This raw k-space data is reconstructed in data processor 68 which operates to transform the data (through Fourier or other techniques) into image data. This image data is conveyed through link 34 to the computer system 20 where it is stored in memory 26. Alternatively, in some systems computer system 20 may assume the image data reconstruction and other functions of data processor 68. In response to commands received from the operator console 12, the image data stored in memory 26 may be archived in long term storage or may be further processed by the image processor 22 or CPU 24 and conveyed to the operator console 12 and presented on the display 16.

In combined PET-MRI scanning systems, PET data may be acquired simultaneously with the MR data acquisition described above. Thus, scanner 48 also contains a positron emission detector array or ring 70, configured to detect gamma rays from positron annihilation radiations emitted from a subject. Detector array 70 preferably includes a plurality of scintillators and photovoltaics arranged about a gantry. Detector array 70 may, however, be of any suitable construction for acquiring PET data. In addition, the scintillator packs, photovoltaics, and other electronics of the detector array 70 are shelled from the magnetic fields and/or RF fields applied by the MR components 54, 56 by way of an RF shell (not shown), as will be explained in detail below.

Gamma ray incidences detected by detector array 70 are transformed, by the photovoltaics of the detector array 70, into electrical signals and are conditioned by a series of front-end electronics 72. These front-end electronics 72 may include various amplifiers, filters, and analog-to-digital converters. The digital signals output by front end electronics 72 are then processed by a coincidence processor 74 to match gamma ray detections as potential coincidence events. When two gamma rays strike detectors approximately opposite one another, it is possible, absent the interactions of random noise and signal gamma ray detections, that a positron annihilation took place somewhere along the line between the detectors.

Thus, the coincidences determined by coincidence processor 74 are sorted into true coincidence events and are ultimately integrated by data sorter 76. The coincidence event data, or PET data, from sorter 76 is received by the system control 32 at a PET data receive port 78 and stored in memory 26 for subsequent processing 68. PET images may then be reconstructed by image processor 22 and may be combined with MR images to produce hybrid structural and metabolic or functional images. Front-end electronics 72, coincidence processor 74 and sorter 76 may each be external of scanner 48 or system control 32, or may be integrated therein.

As shown in FIG. 1, according to an embodiment of the invention, an RF surface coil 80 is positioned adjacent the patient that functions as a receive coil, with the surface coil being connected to the preamplifier 46. As shown in FIG. 1, the RF surface receive coil 80 is constructed as an anterior array (AA) coil positioned on the torso of the patient; however, it is recognized that the RF surface coil 80 could have any of a number of constructions based on the particular scan being performed on the patient. For example, the RF surface coil 80 could instead be a head-neck unit (HNU) coil or other type coil. In operation of the hybrid PET-MRI system 10, the RF surface coil 80 and corresponding region-of-interest (ROI) of the patient that is to be imaged would be positioned within the bore 82 of the system 10 such that the RF surface coil 80 is within the field of view (FOV) of the PET detector array 70, such that both PET and MR imaging data of the patient ROI can be acquired.

Figure 2:
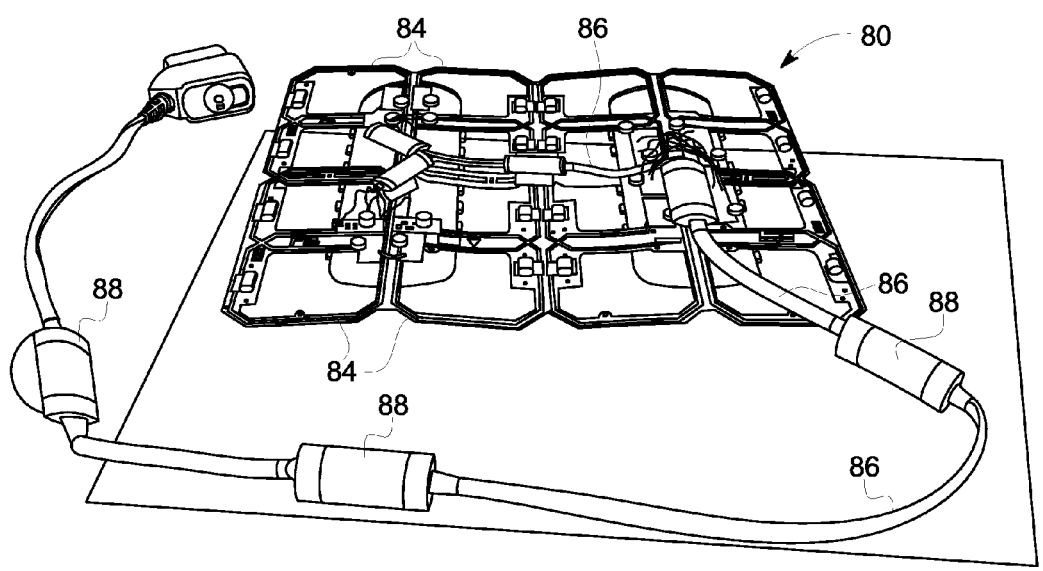
FIGS. 2 and 3 are perspective views of an RF coil assembly and associated non-cylindrical cable balun for use in the PET-MRI system of FIG. 1 according to an embodiment of the invention.
Figure 3:
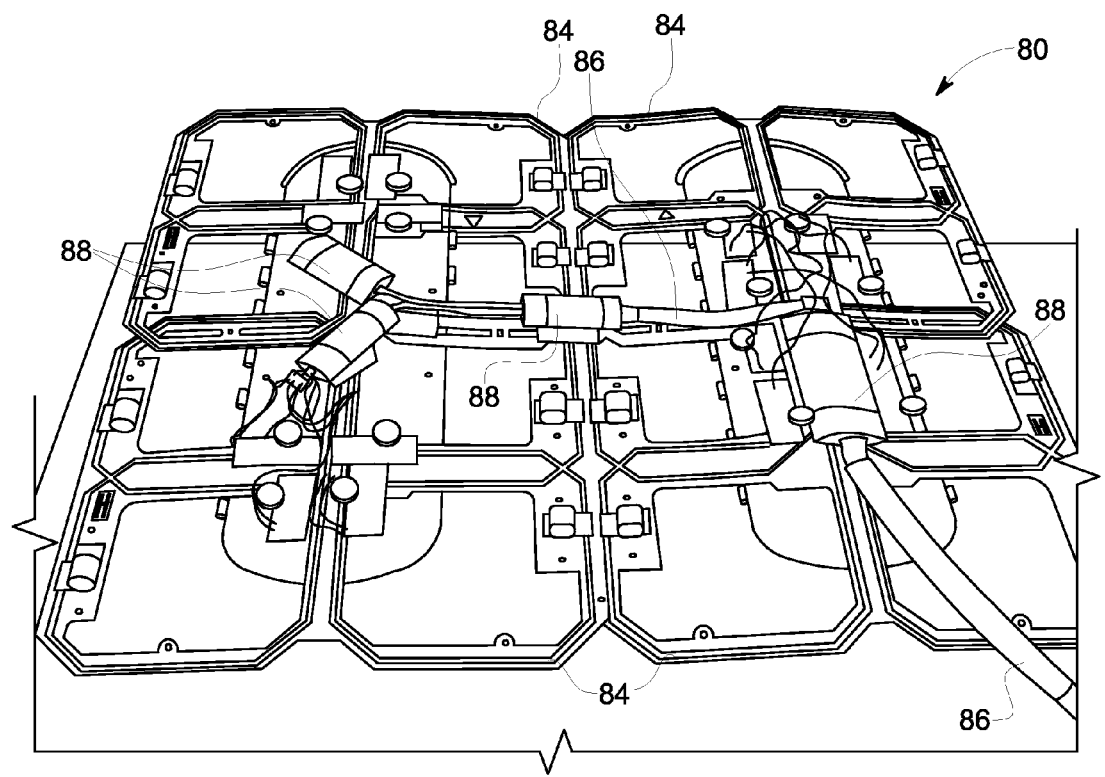

Referring now to FIGS. 2 and 3, an RF surface receiver coil 80 and electronics associated therewith (i.e., coaxial cable and baluns) are shown in various views according to an embodiment of the invention. In the embodiment of FIGS. 2 and 3, the RF surface coil is an AA coil as shown in FIG. 1 positionable on the torso of the patient—although it is recognized that embodiments of the invention could also be implemented with other types of RF receiver coil arrays. The RF surface coil 80 includes a plurality of receiver coil elements 84 therein that collectively form the RF surface coil array 80. In FIGS. 2 and 3, the receiver coil elements 84 collectively form a multiple channel RF receive coil 80—although it is recognized that the RF surface coil 80 could also be configured as a single channel receive coil.

As shown in FIGS. 2 and 3, attached to the receiver coil elements 84 at a plurality of desired locations is a coaxial conductor or cable 86 that provides for a transferring of MR signals received by coil elements 84 to the preamplifier 46 (FIG. 1). For providing conditioning of the electromagnetic signals received by the receiver coil elements 84 prior to receipt of the signals by the preamplifier 46, baluns 88 are provided along the coaxial cable 86. The baluns 88 help to improve performance of the receiver coils 84 by providing a high impedance path for common-mode currents in the electromagnetic signal and a low impedance path for differential currents therein. The baluns 88 create a parallel resonant circuit that can be tuned to the imaging frequency to significantly reduce common mode currents propogating down the coaxial cable 86. In the embodiment shown in FIGS. 2 and 3, where the RF receiver coil 80 comprises a multiple channel RF receiver coil, the baluns 88 have multiple channels, such as 2, 4 channels, 8 channels, 16 channels, or more channels.

Figure 4:
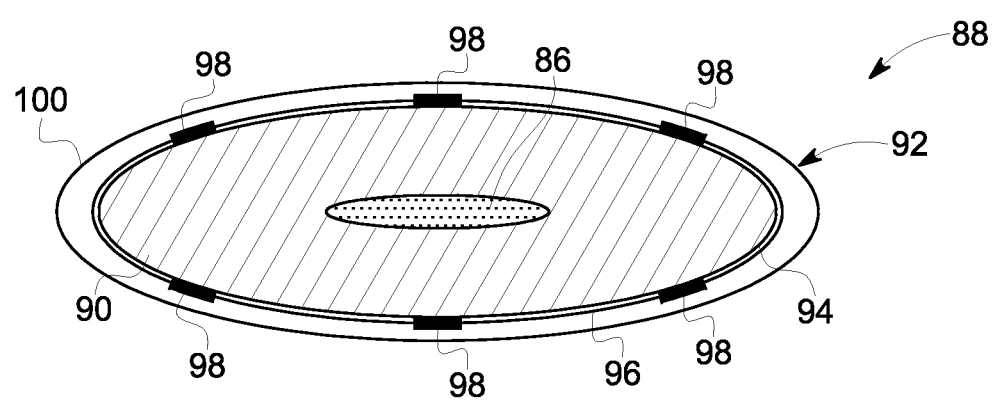
FIG. 4 is a cross-sectional view of a non-cylindrical cable balun according to an embodiment of the invention.

According to an exemplary embodiment of the invention, and as shown in FIGS. 2 and 3 the coaxial cable 86 and baluns 88 collectively have what is referred to hereafter as a "non-cylindrical cable balun" design having a substantially "flat" construction. The non-cylindrical cable balun design is such that the coaxial cable 86 is formed as a non-cylindrical cable (i.e., substantially flat cable profile) having a lower profile in the anterior/posterior (AP) direction, as compared to a conventional cylindrically shaped coaxial cable. The balun 88 also has a non-cylindrical design (i.e., substantially flat) in that the dimensions thereof are reduced in the AP direction as compared to a typical balun design. According to embodiments of the invention, the balun has a thickness in the AP direction of between 0.2 cm and 10 cm—depending on an application in which the balun is implemented. For example, for a balun for a single small coil (e.g., a neonatal), the thickness could be as small as 0.2 cm, whereas for a balun for a coil on the MR system, the thickness could be as much as 10 cm. 1.5 cm or less, such as having a thickness of 1.5 cm for a sixteen-channel balun and a thickness of 1.2 cm for an eight-channel balun. Regardless of the specific thickness, the balun 88 is designed to have a width that is greater than a thickness thereof, with a width ranging from 0.4 cm to 30 cm depending on the thickness of the balun 88. A more detailed view of the construction of balun 88 is shown in FIG. 4. As shown in FIG. 4, balun 88 includes a light dielectric material 90 that surrounds the non-cylindrical coaxial cable 86 as the cable extends through the length of the balun 88. According to an exemplary embodiment of the invention, the dielectric material 90 is in the form of a foam, such as expanded polypropylene (EPP) foam, expanded polyethylene foam, or any other suitable foam material known in the art. The foam 90 functions to control and increase the overall impedance of the balun 88, such that the balun 88 exhibits a high impedance to common-mode currents in the electromagnetic signal.

As further shown in FIG. 4, balun 88 includes an outer housing or balun shell 92 that is applied over the foam 90, so as to house the foam 90 and the non-cylindrical coaxial cable 86 therein—with the foam being positioned within the balun shell 92 so as to fill an interior volume defined by the balun shell. The balun shell 92 has a non-cylindrical construction (i.e., substantially flat profile) that generally mirrors/corresponds to the shape of non-cylindrical coaxial cable 86. According to an exemplary embodiment, the balun shell 92 includes a thin flex material housing 94 formed from a dielectric flex, such as an FR4 composite material composed of woven fiberglass cloth with an epoxy resin binder for example, although it is recognized that other suitable materials may form the shell, such as Kapton® for example. Also included in balun shell 92 is a copper layer 96 that is applied to an outer surface of the flex material housing 94, with the copper layer 96 being in the form of a copper tape or copper sleeve, according to embodiments of the invention, or any other suitable copper form. Soldered to the copper layer 96 of the balun shell 92 are a number of capacitors 98, which are formed on an outer surface of the balun shell 92 so as to be embedded therein. The capacitors 98 function to connect the shell 92 to an output of the non-cylindrical coaxial cable 86, so as to create a parallel resonant circuit that can be tuned to the imaging frequency to significantly reduce common mode currents propogating down the coaxial cable. As further shown in FIG. 4, a shield 100 (e.g., copper shield) is positioned about the balun shell 92.

Beneficially, embodiments of the invention thus provide a non-cylindrical and substantially flat cable balun 88 that provides a lower profile in the AP direction inside RF coils and provides for a lighter RF coil structure when used therewith. In operation, the non-cylindrical cable balun design gives the same electrical performance as a conventional RF coaxial cable balun. However, the non-cylindrical cable balun design has a reduced affect on PET attenuation as compared to a conventional coaxial cable balun—with the non-cylindrical cable balun reducing PET peak single loss from 9% with a conventional cable balun to 5% with the non-cylindrical cable balun, such that an improvement (i.e., reduction) of ~45%, for example, in PET attenuation loss can be achieved with implementation of the non-cylindrical cable balun design.

Therefore, according to one embodiment of the invention, an MRI system includes at least one magnet for generating a magnetic field, at least one gradient coil for manipulating the magnetic field generated by the at least one magnet by way of a gradient field, at least one RF receiver coil to receive electromagnetic signals from the manipulated magnetic field, at least one balun in electrical communication with the at least one RF receiver coil to condition the received electromagnetic signals, and a non-cylindrical coaxial cable to transmit the received electromagnetic signals to the at least one balun. Each of the at least one baluns further includes a balun shell, a dielectric material positioned within the balun shell and surrounding the non-cylindrical coaxial cable which extends through the balun, and one or more capacitors formed on the balun shell.

According to another embodiment of the invention, a balun includes a balun shell having a non-cylindrical profile, a dielectric foam positioned within the balun shell so as to fill an interior volume defined by the balun shell, and one or more capacitors formed on the balun shell, wherein a non-cylindrical coaxial cable that transmits electromagnetic signals to the balun extends through a length of the balun and is surrounded by the dielectric foam.

According to yet another embodiment of the invention, an RF coil assembly includes an array of RF coil elements configured to receive electromagnetic signals from a manipulated magnetic field in an MRI system, a plurality of baluns in electrical communication with the array of RF coil elements to condition the received electromagnetic signals, and a non-cylindrical coaxial cable to transmit the received electromagnetic signals to the plurality of baluns. Each of the plurality of baluns further includes a non-cylindrical balun shell, a dielectric material positioned within the balun shell and surrounding the non-cylindrical coaxial cable which extends through the balun, and a plurality of capacitors positioned on an outer surface of the non-cylindrical balun shell.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A magnetic resonance imaging (MRI) system comprising:
   at least one magnet for generating a magnetic field;
   at least one gradient coil for manipulating the magnetic field generated by the at least one magnet by way of a gradient field;
   at least one radio frequency (RF) receiver coil to receive electromagnetic signals from the manipulated magnetic field;
   at least one balun in electrical communication with the at least one RF receiver coil to condition the received electromagnetic signals; and
   a coaxial cable to transmit the received electromagnetic signals to the at least one balun, the coaxial cable comprising a non-cylindrical coaxial cable;
   wherein each of the at least one baluns comprises:
      a balun shell; and
      a dielectric material positioned within the balun shell and surrounding the non-cylindrical coaxial cable which extends through the balun; and
      one or more capacitors formed on the balun shell.

2. The MRI system of claim 1 wherein the dielectric material comprises expanded polypropylene (EPP) foam that increases an impedance of the balun to common-mode currents.

3. The MRI system of claim 1 wherein each of the at least one baluns comprises a non-cylindrical balun that generally corresponds in shape to the non-cylindrical coaxial cable.

4. The MRI system of claim 1 wherein the balun shell comprises:
   a dielectric flex housing comprising an inner surface and an outer surface; and
   a copper layer applied to the outer surface of the dielectric flex housing; and
   wherein the inner surface of the dielectric flex housing contacts the dielectric material.

5. The MRI system of claim 4 wherein the dielectric flex housing is formed from an FR4 composite material comprised of woven fiberglass cloth with an epoxy resin binder.

6. The MRI system of claim 4 wherein the copper layer comprises copper tape.

7. The MRI system of claim 1 wherein the at least one RF receiver coil comprises an RF surface coil array.

8. The MRI system of claim 1 wherein the at least one balun has a thickness of between 0.2 and 10 cm in the anterior/posterior direction.

9. The MRI system of claim 1 further comprising a positron emission tomography (PET) system integrated with the MRI system, the PET system having a detector array to acquire PET emissions of a subject of interest.

10. The MRI system of claim 9 wherein the non-cylindrical coaxial cable and the at least one balun minimize PET gamma ray attenuation.

11. A balun comprising:
   a balun shell having a non-cylindrical profile;
   a dielectric foam positioned within the balun shell so as to fill an interior volume defined by the balun shell; and
   one or more capacitors formed on the balun shell;
   wherein a non-cylindrical coaxial cable that transmits electromagnetic signals to the balun extends through a length of the balun and is surrounded by the dielectric foam.

12. The balun of claim 11 wherein the dielectric foam comprises an expanded polypropylene (EPP) foam that increases an impedance of the balun to common-mode currents.

13. The balun of claim 12 wherein the balun shell comprises:
   a dielectric flex housing comprising an inner surface and an outer surface; and
   a copper layer applied to the outer surface of the dielectric flex housing; and
   wherein the inner surface of the dielectric flex housing contacts the EPP foam.

14. The balun of claim 13 wherein the dielectric flex housing is formed from an FR4 composite material comprised of woven fiberglass cloth with an epoxy resin binder.

15. The balun of claim 13 wherein the copper layer comprises copper tape.

16. The balun of claim 11 wherein the balun has a thickness of between 0.2 and 10 cm in the anterior/posterior direction.

17. The balun of claim 11 wherein the one or more capacitors are embedded in the balun shell.

18. A radio frequency (RF) coil assembly comprising:
   an array of RF coil elements configured to receive electromagnetic signals from a manipulated magnetic field in a magnetic resonance imaging (MRI) system;
   a plurality of baluns in electrical communication with the array of RF coil elements to condition the received electromagnetic signals; and
   a non-cylindrical coaxial cable to transmit the received electromagnetic signals to the plurality of baluns;
   wherein each of the plurality of baluns comprises:
      a non-cylindrical balun shell;
      a dielectric material positioned within the balun shell and surrounding the non-cylindrical coaxial cable which extends through the balun; and
      a plurality of capacitors positioned on an outer surface of the non-cylindrical balun shell.

19. The RF coil assembly of claim 18 wherein the dielectric material comprises expanded polypropylene (EPP) foam that increases an impedance of the balun to common-mode currents.

20. The RF coil assembly of claim 18 wherein the balun shell comprises:
   a housing formed of a dielectric flex material comprising an inner surface and an outer surface; and
   a copper tape applied to the outer surface of the dielectric flex housing; and
   wherein the inner surface of the dielectric flex housing contacts the dielectric material.

* * * * *